US011768524B2

(12) United States Patent
Siddiqui

(10) Patent No.: US 11,768,524 B2
(45) Date of Patent: Sep. 26, 2023

(54) ELECTRONIC DEVICE HINGE WITH MOVABLE RIGID DISPLAY SUPPORT

(71) Applicant: Microsoft Technology Licensing, LLC, Redmond, WA (US)

(72) Inventor: Kabir Siddiqui, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 32 days.

(21) Appl. No.: 17/020,113

(22) Filed: Sep. 14, 2020

(65) Prior Publication Data

US 2021/0397226 A1     Dec. 23, 2021

Related U.S. Application Data

(60) Provisional application No. 63/042,505, filed on Jun. 22, 2020.

(51) Int. Cl.
*G06F 1/16*     (2006.01)
*H10K 50/80*     (2023.01)
*H10K 102/00*     (2023.01)

(52) U.S. Cl.
CPC .......... *G06F 1/1681* (2013.01); *G06F 1/1616* (2013.01); *G06F 1/1652* (2013.01); *G06F 1/1656* (2013.01); *H10K 50/80* (2023.02); *H10K 2102/311* (2023.02)

(58) Field of Classification Search
CPC .... G06F 1/1681; G06F 1/1616; G06F 1/1652; G06F 1/1656
See application file for complete search history.

(56) References Cited

U.S. PATENT DOCUMENTS

| 8,523,131 | B2* | 9/2013 | Derry | F16M 11/10 |
| | | | | 248/292.13 |
| 9,348,450 | B1 | 5/2016 | Kim | |
| 9,983,627 | B1* | 5/2018 | Pelissier | G06F 1/1681 |
| 10,054,990 | B1 | 8/2018 | Harmon | |
| 10,485,115 | B1* | 11/2019 | Cromer | E05D 7/00 |

(Continued)

FOREIGN PATENT DOCUMENTS

WO     2015190733 A1     12/2015

OTHER PUBLICATIONS

"Razr", Retrieved from: https://www.motorola.com/us/smartphones-razr, Retrieved Date: Aug. 14, 2020, 13 Pages.

(Continued)

*Primary Examiner* — Abhishek M Rathod
(74) *Attorney, Agent, or Firm* — RAY QUINNEY & NEBEKER P.C.; Paul N. Taylor

(57) ABSTRACT

A hinge for a foldable electronic device includes a spine, a first hinge guide, a second hinge guide, and a display support. The first hinge guide is rotatably connected to the spine around a first axis. The second hinge guide rotatably connected to the spine around a second axis. The display support is connected to the first hinge guide in a first track and connected to the second hinge guide by a second track. A translational position of the display support relative to the spine is related to a first rotational position of the first hinge guide relative to the spine and a second rotational position of the second hinge guide relative to the spine.

22 Claims, 9 Drawing Sheets

(56) References Cited

U.S. PATENT DOCUMENTS

| | | | |
|---|---|---|---|
| 2005/0239520 A1* | 10/2005 | Stefansen | H04M 1/022 455/575.1 |
| 2012/0264489 A1 | 10/2012 | Choi et al. | |
| 2013/0021762 A1 | 1/2013 | Van Dijk | |
| 2014/0042293 A1 | 2/2014 | Mok | |
| 2015/0013107 A1* | 1/2015 | Shin | G06F 1/1681 16/366 |
| 2015/0241925 A1 | 8/2015 | Seo et al. | |
| 2015/0366089 A1* | 12/2015 | Park | G06F 1/1641 361/679.01 |
| 2016/0187935 A1* | 6/2016 | Tazbaz | H04M 1/0216 361/679.03 |
| 2016/0302314 A1 | 10/2016 | Bae et al. | |
| 2018/0292860 A1* | 10/2018 | Siddiqui | H04M 1/0216 |
| 2018/0313399 A1 | 11/2018 | Nakamura | |
| 2018/0356858 A1* | 12/2018 | Siddiqui | H04M 1/022 |
| 2020/0117233 A1* | 4/2020 | Ou | E05D 7/00 |

OTHER PUBLICATIONS

"International Search Report and Written Opinion Issued in PCT Application No. PCT/US2021/029029", dated Jul. 15, 2021, 12 Pages.

\* cited by examiner

ELECTRONIC DEVICE HINGE WITH MOVABLE RIGID DISPLAY SUPPORT

PRIORITY CLAIM

This application claims priority to and the benefit of U.S. Provisional Patent Application No. 63/042,505 titled "ELECTRONIC DEVICE HINGE WITH MOVABLE RIGID DISPLAY SUPPORT" filed Jun. 22, 2020, the disclosure of which is incorporated herein by reference in its entirety.

BACKGROUND

Background and Relevant Art

Foldable electronic devices have a hinge dividing the device into a first portion and a second portion. Conventional foldable electronic devices use a single display panel on one of the first portion or the second portion, such as a conventional laptop computer. Some foldable electronic devices use a pair of display panels, with one positioned on each of the first portion and the second portion, and the pair of display panels has a break or gap therebetween at the hinge.

BRIEF SUMMARY

In some embodiments, a hinge for a foldable electronic device is described. The hinge includes a spine, a first hinge guide, a second hinge guide, and a display support. The first hinge guide is rotatably connected to the spine around a first axis. The second hinge guide rotatably connected to the spine around a second axis. The display support is connected to the first hinge guide in a first track and connected to the second hinge guide by a second track. A translational position of the display support relative to the spine is related to a first rotational position of the first hinge guide relative to the spine and a second rotational position of the second hinge guide relative to the spine.

A foldable electronic device, according to some embodiments, is described. The foldable electronic device includes a first chassis, a second chassis, and a hinge. The hinge includes a spine, a first hinge guide, a second hinge guide, and a display support. The first hinge guide is rotatably connected to the spine. The second hinge guide rotatably connected to the spine. The display support is connected to the first hinge guide in a first track and connected to the second hinge guide by a second track. A translational position of the display support relative to the spine is related to a first rotational position of the first hinge guide relative to the spine and a second rotational position of the second hinge guide relative to the spine.

In some embodiments, a foldable electronic device is described. The foldable electronic device includes a first chassis, a second chassis, and a hinge. The hinge includes a spine, a first hinge guide, a second hinge guide, and a display support. The first hinge guide is rotatably connected to the spine. The second hinge guide rotatably connected to the spine. The display support is connected to the first hinge guide in a first track and connected to the second hinge guide by a second track. A translational position of the display support relative to the spine is related to a first rotational position of the first hinge guide relative to the spine and a second rotational position of the second hinge guide relative to the spine. A flexible OLED display panel is connected to the first chassis and second chassis and crossing the hinge. An elastic cover is connected to the first chassis and the second chassis and crossing the hinge.

This Summary is provided to introduce a selection of concepts in a simplified form that are further described below in the Detailed Description. This Summary is not intended to identify key features or essential features of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

Figure 1:
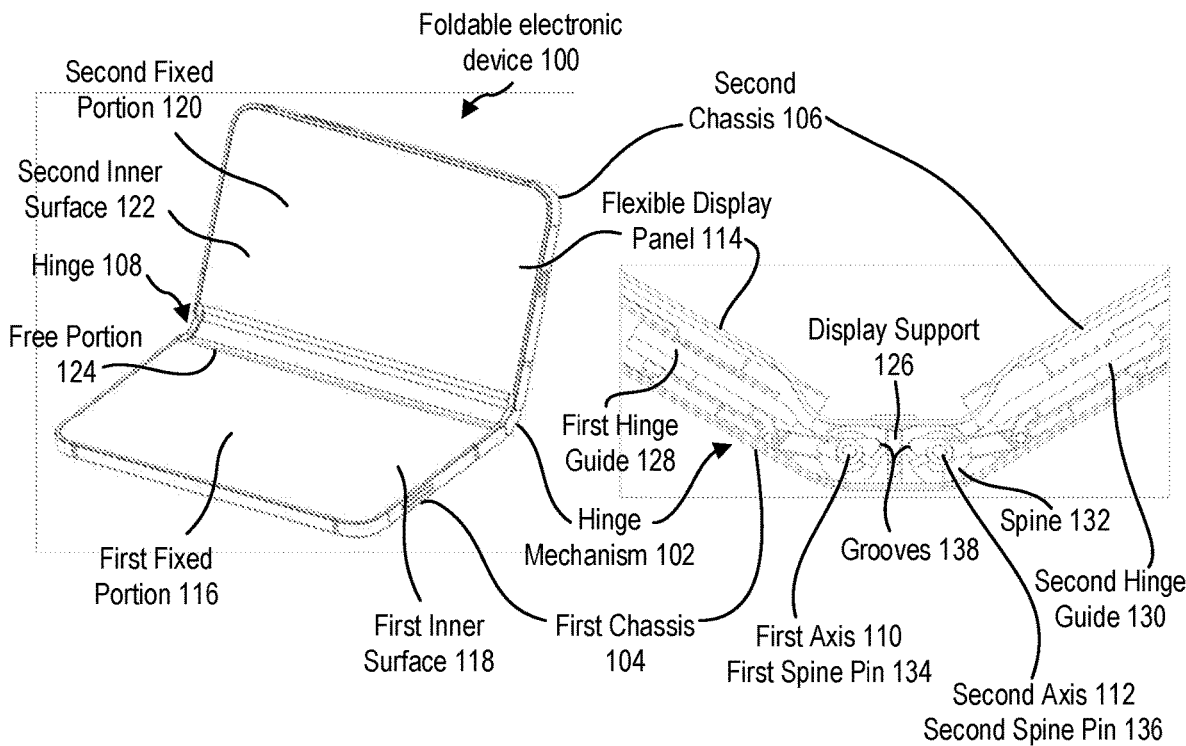
FIG. 1 is a perspective view and detail cross-sectional view of a foldable electronic device in a laptop posture with a hinge including a display support, according to at least some embodiments of the present disclosure.

The present disclosure relates generally to systems and methods for controlling movement of portions of a foldable electronic device. More particularly, the present disclosure relates to embodiments of a hinge that supports a flexible display panel in a foldable electronic device. In some embodiments, a foldable electronic device has a flexible display panel that is continuous across a hinge between chassis. The flexible display has a minimum radius of curvature before the flexible display panel is damaged. Further, in some embodiments, the flexible display has limited or no in-plane elasticity, and an area of the flexible display panel must be maintained in and over the hinge as the foldable electronic device opens and closes through a variety of postures.

Conventional foldable electronic devices with a flexible display panel cannot fold the first portion and second portion parallel with the planes of the folded flexible display panel parallel due to the minimum radius of curvature of the flexible display panel. The resulting foldable electronic device has a wedge shape with a relatively larger radius of curvature proximate the hinge of the device. The wedge shape is undesirable for strength and safety during transport and storage, as well as undesirable aesthetically.

Embodiments of a hinge according to the present disclosure include a display support that translates in a first translational direction relative to the hinge and the chassis to provide clearance within the hinge and allow a larger radius of curvature in some postures and prevent damage to the flexible display panel when the flexible display panel is on an interior side of the foldable electronic device. In some embodiments, the display support translates in an opposite second translational direction to provide clearance and support to the flexible display panel when the flexible display panel is on an exterior side of the foldable electronic device.

In some embodiments, a foldable electronic device has a first chassis and a second chassis that rotatably connected to one another by a hinge. In some embodiments, the hinge allows the two chassis of the foldable electronic device to move through a rotational range of movement relative to one another of at least 180°. In some embodiments, the foldable electronic device is movable through a series of postures in the rotational range of movement from a closed posture with 0° between the first chassis and second chassis to a 360° posture with the hinge open to 360° between the first chassis and second chassis. Foldable electronic devices include, but are not limited to, laptop computers, hybrid computers, tablet computers, smartphones, large-format smartphones (e.g., phablets), and other portable electronic devices.

In some embodiment, the first chassis and/or second chassis are a rigid frame of the foldable electronic device. The chassis contains and/or supports components of the electronic device, such as a storage device, power supply, central processing unit (CPU), graphical processing unit (GPU), motherboard, bridge, communication device, antenna, communication ports, display panel, audio device, input device, other electronic components, thermal management devices, and other components. The foldable electronic device has a first chassis and a second chassis with communication cables or wires therebetween to allow electrical and/or data communication between electronic components contained in or on the first chassis and the second chassis.

The hinge is a rotationally movable connection between the first chassis and second chassis of the foldable electronic device. In some embodiments, the hinge includes at least two hinge mechanisms that each connect the first chassis to the second chassis. The two hinge mechanisms are connected through the display support and through the chassis to rotate together. In some embodiments, the hinge includes a friction mechanism that resists rotation of the first chassis and second chassis relative to one another to support the first chassis and second chassis at a variety of postures. In some embodiments, the hinge includes a linkage to correlate the rotational position of the first chassis and second chassis to a translational position of a display support relative to at least part of the hinge. In some embodiments, the hinge mechanism has two axes of rotation (e.g., two pins) and the rotation of the parts of hinge mechanism around those two axes is symmetrical. A 180° movement of the hinge mechanism includes 90° of movement around each of the axes. A 360° movement of the hinge mechanism includes 180° of movement around each of the axes.

In some embodiments, the foldable electronic device includes a flexible display panel. The flexible display panel is configured to emit light and display visual information and is bendable with a minimum radius of curvature. Visual information includes video, images, text, or other dynamically created patterns of light to convey information to a viewer of the display panel. In some embodiments, the flexible display panel is an organic light emitting diode (OLED) display panel. In some embodiments, the flexible display panel is a flexible electronic paper (e-paper) display panel. A flexible display panel can be a touch-sensitive display allowing capacitive or resistive touch-based interaction. The flexible display panel has a first fixed portion fixed relative to the first chassis, a second fixed portion fixed relative to the second chassis, and a free portion proximate the hinge that is allowed to bend in or around the hinge in various postures of the foldable electronic device.

In some embodiments, the flexible display panel is a continuous display panel that crosses the hinge and is at least partially located on and/or supported by the first chassis and second chassis. In some embodiments, a continuous display panel is a single flexible display panel that bridges the hinge in contrast to two discrete display panels that are coordinated to display visual information with an appearance of a single display.

In some embodiments, the foldable electronic device is positionable in a variety of postures. In some embodiments, the foldable electronic device has a plurality of postures between 0° and 360° around the hinge axes. In some embodiments, a closed posture is the posture of the foldable electronic device when the first chassis and second chassis are in a closed position with an approximate 0° angle between inner surfaces thereof. The flexible display panel is positioned between the first chassis and second chassis and protected for transport, storage, and charging.

In some embodiments, a laptop posture is the posture of the foldable electronic device when the first chassis and second chassis are positioned with an angle of between 0° and 180° between inner surfaces thereof. For example, when the first chassis and second chassis are positioned with an angle of 120° therebetween, the first chassis is positioned flat on a surface with the first fixed portion of the flexible display panel providing a touch-input "keyboard", and the second chassis is positioned to orient the second fixed portion of the display panel toward the user, similar to a conventional laptop, with the flexible display panel in the interior side of the angle.

In some embodiments, a flat posture is the posture of the foldable electronic device when the first chassis and second chassis are positioned with an angle of approximately 180° between inner surfaces thereof. In the flat posture, the flexible display panel is substantially flat, and at least 90% of the flexible display panel lies in a single plane.

In some embodiments, a presentation posture is the posture of the foldable electronic device when the first chassis and second chassis are positioned with an angle of between 180° and 360° between inner surfaces thereof. For example, when the when the first chassis and second chassis are positioned with an angle of 270° between inner surfaces thereof, the first chassis and the second chassis can support the hinge at an apex of the foldable electronic device to stand the foldable electronic device on the outermost edges of the first chassis and second chassis. The flexible display panel is oriented outward and visual information can be displayed to users from the first fixed portion of the flexible display panel (proximate the first chassis) or the second fixed portion of the flexible display panel (proximate the second chassis) in a freestanding posture. In another example, the first chassis is positioned flat on a surface with the first fixed portion of the flexible display panel oriented downward toward the surface, and the second chassis is positioned to orient the second fixed portion of the flexible display panel toward the user, providing a more compact posture for presentation of visual information to a user than a laptop posture.

In some embodiments, a 360° posture is the posture of the foldable electronic device in which the first chassis and second chassis are positioned with an angle of 360° between inner surfaces thereof. The foldable electronic device is fully opened and inverted from the closed posture with the flexible display panel positioned on the inner surfaces of the first chassis and second chassis facing outward and forming substantially all of the exterior surface of the foldable electronic device.

As the foldable electronic device moves from the closed posture to the 360° posture, the hinge translates a display support relative to a spine of the hinge to support the flexible display panel and provide clearance for the flexible display panel. In some embodiments, the hinge further allows linear displacement of the chassis relative to portions the hinge. By translating the connection points between the chassis and hinge, the hinge maintains an equal path length through or around the hinge for the flexible display panel as the foldable electronic device rotates. In some embodiments, the flexible display panel can bend within and interior of the hinge in the closed posture and bend around the exterior of the hinge in the 360° posture without compressing or stretching the flexible display panel in the plane of the flexible display panel.

FIG. 1 is a perspective view of an embodiment of a foldable electronic device 100 according to the present disclosure and a detail cross-sectional view of a hinge mechanism 102 of the foldable electronic device representative of the posture in which the foldable electronic device of FIG. 1 is shown. The foldable electronic device 100 is illustrated in a laptop posture. The foldable electronic device includes a first chassis 104 and a second chassis 106 connected by a hinge 108. In some embodiments, the hinge 108 includes two hinge mechanisms 102.

In some embodiments, as the foldable electronic device 100 moves from a closed posture to a laptop posture, the hinge 108 rotates around the first axis 110 and second axis 112 to move the second chassis 106 relative to the first chassis 104. The foldable electronic device 100 includes a flexible display panel 114. A first fixed portion 116 of the flexible display panel 114 is supported on the first inner surface 118 of the first chassis 104 and a second fixed portion 120 of the flexible display panel 114 is supported on the second inner surface 122 of the second chassis 106. A free portion 124 of the flexible display panel 114 crosses the hinge 108 therebetween.

In some embodiments, the hinge 108 includes a first hinge mechanism 102 and a second hinge mechanism 102 that are symmetrical on either side of the hinge 108. A rigid display support 126 connects the hinge mechanisms 102 across the width of the foldable electronic device 100. In some embodiments, the hinge mechanism 102 includes a first hinge guide 128 and a second hinge guide 130 that are each rotatably connected to a spine 132. The first hinge guide 128 is rotatable around a first spine pin 134 at the first axis 110, and the second hinge guide 130 is rotatable around a second spine pin 136 at the second axis 112 of the hinge mechanism 102.

In some embodiments, the translational position of the display support 126 relative to the hinge guides 128, 130 and the spine 132 is correlated to a first rotational position of the first hinge guide 128 around the first axis 110 and a second rotational position of the second hinge guide 130 around the second axis 112. In some embodiments, the rotational positions and the translation position are correlated by the movement of hinge guide pins that track within grooves 138 in the display support 126. In some embodiments, the shape of the grooves 138 in the display support 126 determine the rate and direction of the translation of the display support 126 relative to the rotations of the first hinge guide 128 and second hinge guide 130 around the first axis 110 and second axis 112, respectively.

For example, a groove 128 in the display support 126 with no change in radial position relative to the first axis 110 allows the first hinge guide 128 to rotated around the first axis 110 without applying force and/or moving to the display support 126. When the groove 128 is radially angled relative to the first axis 110 (i.e., the groove changes radially distance to the first axis 110 around the first axis 110), rotation of the first hinge guide 128 around the first axis 110 applies a force to and/or moves the display support 126. Therefore, the shape and angular position of the grooves 128 can translate the rotation of the hinge guides 128, 130 to movement of the display support 126 relative to the first axis 110 and second axis 112. While the presently described embodiments include symmetrical grooves to move the display support uniformly relative to the rotation of the first hinge guide 128 and second hinge guide 130, in some embodiments, the grooves 128 may be asymmetrical to induce different rates of movement of the display support relative to the first axis 110 and second axis 112. In other embodiments, other shapes of grooves 128 can be used to move the display support at non-linear speeds relative to rotation of the hinge guides 128, 130 and/or the grooves may have a continuous change in radial distance from the axes 110, 112.

Figure 2:
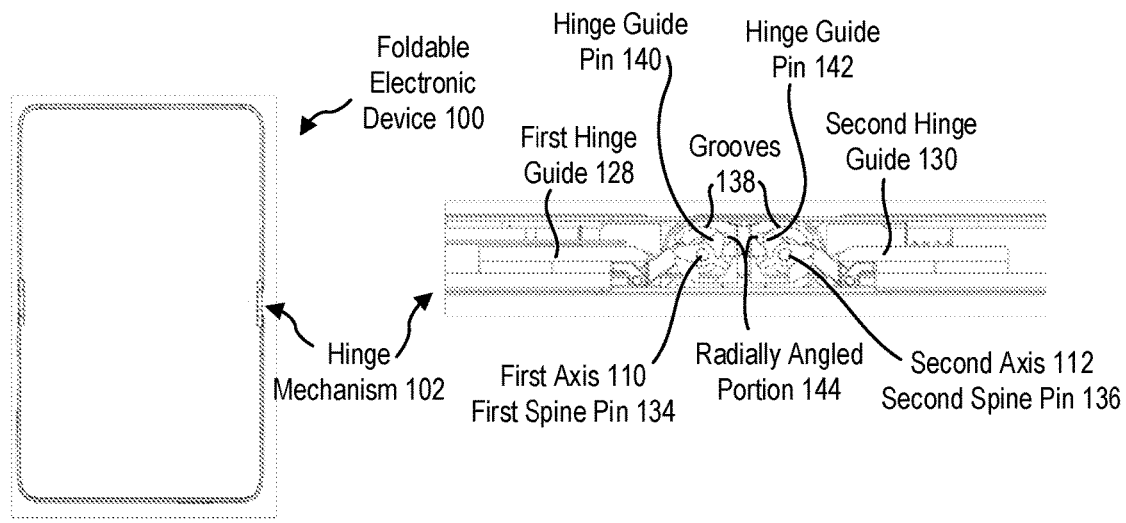
FIG. 2 is a front view and detail cross-sectional view of the foldable electronic device of FIG. 1 in a flat posture with a hinge including a display support, according to at least some embodiments of the present disclosure.

FIG. 2 is a perspective view of the foldable electronic device 100 of FIG. 1 and a detail cross-sectional view of the hinge mechanism 102 representative of the flat posture in which the foldable electronic device 100 is shown in FIG. 2.

In some embodiments, the hinge guide pins 140, 142 track within a radially angled portion 144 of the groove 138 between the closed posture and the flat posture. The radially angled portions 144 of the grooves 138 are oriented at non-perpendicular angles to the radial direction of the axes 110, 112, respectively. Rotation of the first hinge guide and second hinge guide around the pins of the spine, therefore, produces displacement of the display support relative to the spine as the hinge guide pins track through the radially angled portion of the groove.

Figure 3:
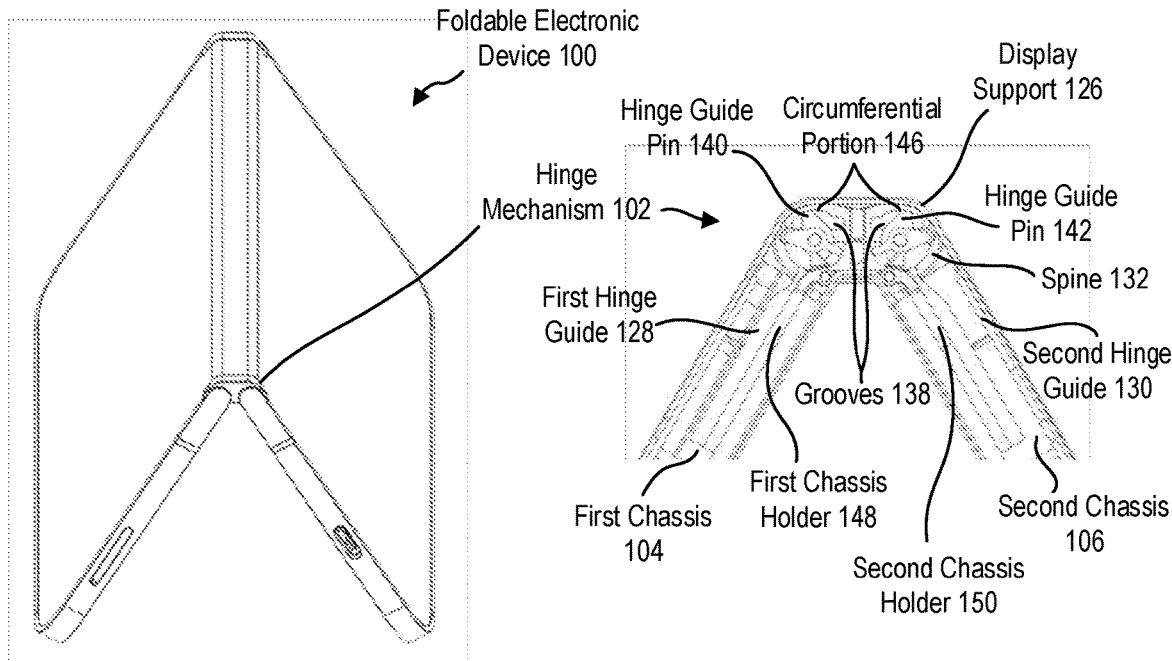
FIG. 3 is a perspective view and detail cross-sectional view of the foldable electronic device of FIG. 1 in a presentation posture with a hinge including a display support, according to at least some embodiments of the present disclosure.

FIG. 3 is a perspective view of the foldable electronic device 100 of FIG. 1 and a detail cross-sectional view of the hinge mechanism 102 representative of the presentation posture in which the foldable electronic device 100 is shown in FIG. 3.

As the foldable electronic device 100 moves from the flat posture toward and through the presentation posture, in some embodiments, the hinge guide pins 140, 142 track through a circumferential portion 146 of the grooves 138. The circumferential portion 146 of the groove 138 has no or approximately no change in the radial direction, and the angular movement through the circumferential portion 146 of the groove 138 results in no translation of the display support 126. In some embodiments, the circumferential portion 146 of each groove 138 has an arc of 90° around each of the axes. The 90° arc around each groove 138 sums to a 180° movement of the foldable electronic device 100 from the flat posture, through the presentation posture, to the 360° posture.

The rotation of the hinge guides 128, 130 from the flat posture to the 360° posture also includes conversion of the rotational movement of the hinge guides 128, 130 to linear movement of chassis holders 148, 150. In some embodiments, the chassis holders 148, 150 are a pair of symmetrical components (e.g., the same on either side of the hinge mechanism 102) that each connect to one of the first hinge guide 128 and the second hinge guide 130, respectively. In some embodiments, the chassis holder 148, 150 is fixed to a chassis 104, 106 on either side of the hinge mechanism 102 (e.g., the first chassis holder 148 is fixed to the first chassis 104 and the second chassis holder 150 is fixed to the second chassis 106) and is slidable in slots of the hinge guide 128, 130. In some embodiments, the linear movement of the chassis holders 148, 150 in response to the rotational movement of the hinge guides 128, 130 moves the chassis 104, 106 toward or away from the spine 132 of the hinge mechanism 102.

Figure 4:
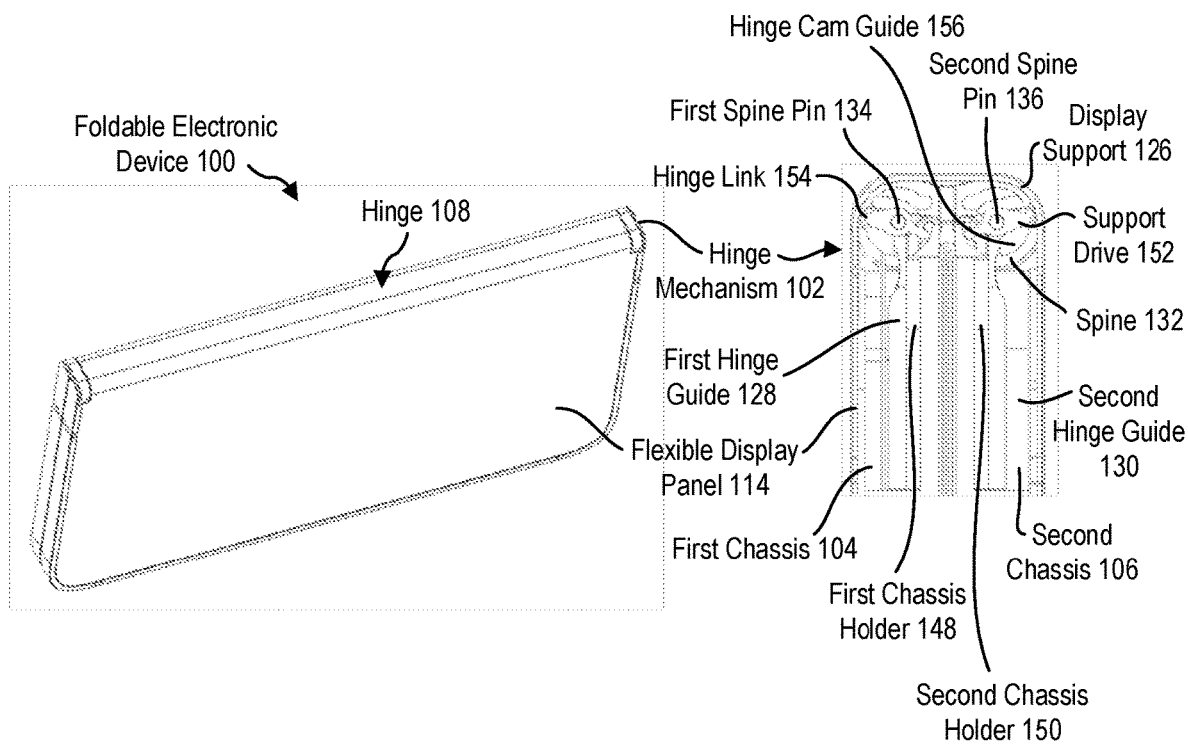
FIG. 4 is a perspective view and detail cross-sectional view of the foldable electronic device of FIG. 1 in a 360° posture with a hinge including a display support, according to at least some embodiments of the present disclosure.

FIG. 4 is a perspective view of the foldable electronic device 100 of FIG. 1 and a detail cross-sectional view of the hinge mechanism 102 representative of the 360° posture in which the foldable electronic device 100 is shown in FIG. 4.

In some embodiments, the chassis holders 148, 150 move toward the spine 132 as the foldable electronic device 100 moves from the flat posture toward the 360° posture, and the chassis holders 148, 150 move away from the spine 132 as the foldable electronic device 100 moves away from the 360° posture and toward the flat posture. Because the flexible display panel 114 bends and wraps around the exterior side of the spine 132 and display support 126 between the flat posture and the 360° posture, the linear movement of the chassis holders 148, 150 (and hence the chassis to which the flexible display panel is anchored) toward to the spine 132 and display support 126 ensures the flexible display panel 114 is not under excessive tension while wrapped around the hinge 108.

In some embodiments, the chassis holders 148, 150 move linearly away from the spine 132 and remain distant from the spine 132 from the flat posture to the closed posture in order to move the chassis 104, 106 away from the spine 132 and display support 126. In some embodiments, the chassis 104, 106, and hence the fixed portions of the flexible display panel 114, move away from the hinge 108 to provide clearance for the free portion of the flexible display panel 114 to bend inside the hinge 108 while maintaining the minimum radii of curvature of the flexible display panel 114 to avoid damage.

In some embodiments, the linear position of the chassis holders 148, 150 in the slots is correlated to the rotational position of the hinge mechanism 102 by the support drives 152 and hinge links 154. The support drives 152 are freely rotatable around each of the spine pins 134, 136, respectively, in response to rotation of the hinge guides 128, 130 around the spine pins 134, 136 from the closed posture to the flat posture.

In some embodiments, the support drives 152 interact with a hinge cam guide 156 to limit and/or prevent further rotation of the support drives 152 past the flat posture. In some embodiments, continued rotation of the hinge guides 128, 130 around the spine pins 134, 136 causes the support drives 152 to contact a surface of the hinge cam guide 156 and causes the support drives 152 to apply a force to the chassis holders 148, 150.

In some embodiments, the support drives 152 pull the chassis 104, 106 toward the spine 132 when the foldable electronic device 100 moves toward the 360° posture. In some embodiments, the support drives 152 push the chassis 104, 106 away from the spine 132 when the foldable electronic device 100 moves away from the 360° posture. In some embodiments, a biasing element urges the chassis 104, 106 away from the hinge guide 128, 130 and spine 132. The forces applied to the chassis holders 148, 150 by the support drives 152 pulls the chassis 104, 106 toward the hinge guide 128, 130 and spine 132 when the foldable electronic device 100 moves toward the 360° posture, and the biasing element pushes the chassis 104, 106 away when the foldable electronic device 100 moves away from the 360° posture.

In some embodiments, the biasing element is a coil spring. In some embodiments, the biasing element is a piston and cylinder with a compressible medium therein such as a compressible gas. In some embodiments, the biasing element is one or more magnets that applies a magnetic force to the chassis. The biasing element may therefore provide different force curves to complement the shape of the grooves to move the chassis 104, 106 away from the spine 132 to reduce wear on the grooves and support drives 152.

Figure 5:
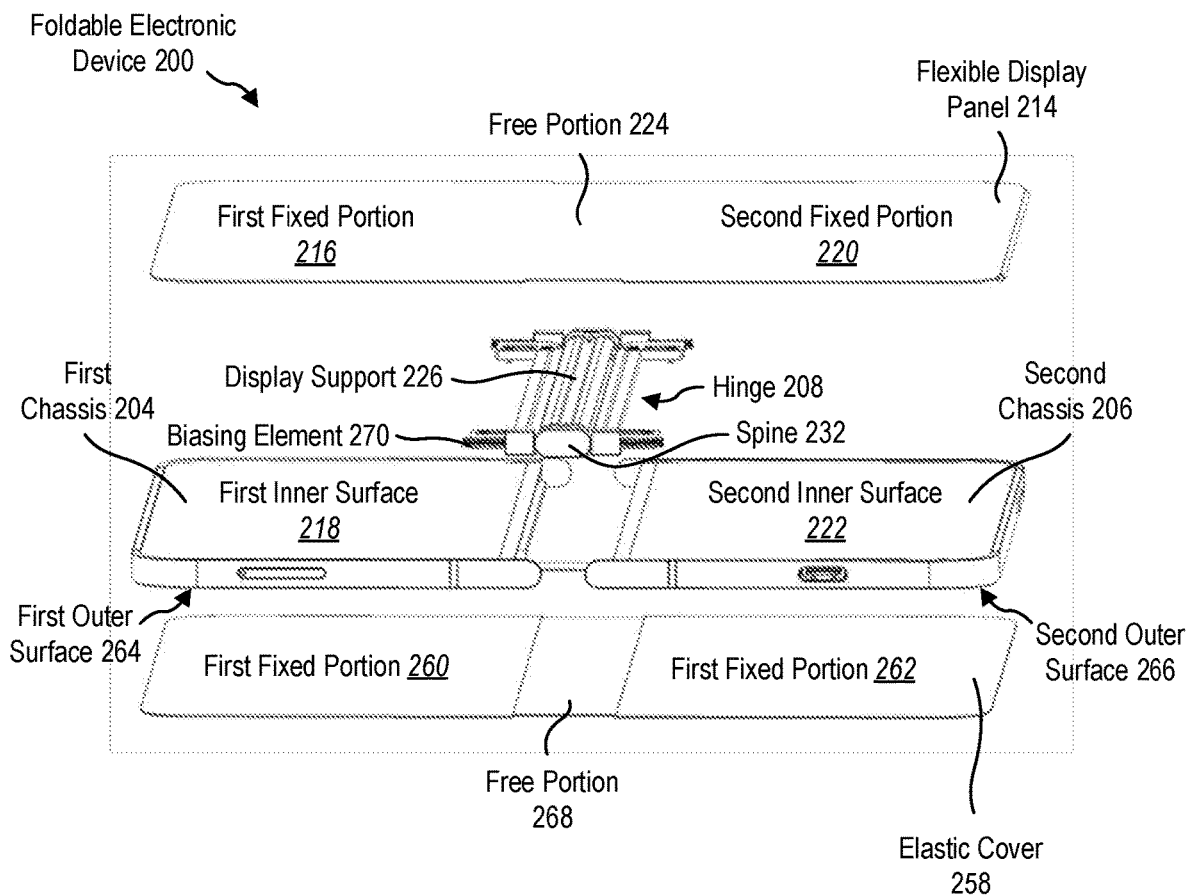
FIG. 5 is an exploded view a foldable electronic device in a flat posture, according to at least some embodiments of the present disclosure.

FIG. 5 is an exploded view of an embodiment of a foldable electronic device 200, according to the present disclosure. In some embodiments, the first fixed portion 216 of the flexible display panel 214 is fixed to a first inner surface 218 of the first chassis 204 and the second fixed portion 220 of the flexible display panel 214 is fixed to a second inner surface 222 of the second chassis 206. A free portion 224 crosses the hinge 208 between the first chassis 204 and the second chassis 206 and is free to move.

In some embodiments, the foldable electronic device 100 includes an elastic cover 258 positioned on the outer surfaces 264, 266 of the chassis 204, 206. It should be understood that inner surface and outer surface are relative to the closed posture, and in the 360° posture, the inner surfaces 218, 222 of the chassis 204, 206 are oriented outward and the outer surfaces 264, 266 of the chassis 204, 206 are oriented inward relative to the chassis 204, 206. In some embodiments, a first fixed portion 260 of the elastic cover 258 is fixed to a first outer surface 264 of the first chassis 204 and a second fixed portion 262 of the elastic cover 258 is fixed to a second outer surface 266 of the second chassis 206. A free portion 268 of the elastic cover 258 crosses the hinge 208 between the first chassis 204 and the second chassis 206 and is free to stretch.

In some embodiments, only the free portion 268 of the elastic cover 258 is elastically deformable. For example, the free portion 268 stretches and/or bends while the fixed portions 260, 262 remain static, reducing wear and tear on the fixed portions 260, 262 or allowing the fixed portions 260, 262 to be made of a different, more durable material. In some embodiments, the entire elastic cover 258 is elastically deformable. For example, an elastic cover 258 that is uniform provides a uniform look and feel for the user, as well as can provide better grip while moving or using the device. In some embodiments, at least part of the free portion 268 and a part of a fixed portion 260, 262 is elastically deformable. In some embodiments, the free portion 268 is anisotropically elastic. For example, the free portion 268 can be elastic in the direction of tension around the hinge, while resisting movement in a lateral direction to keep the free portion 268 positioned over the display support and/or inside the dimensions of the chassis 204, 206.

As the elastic cover 258 is able to withstand smaller radii of curvature than the flexible display panel 214, the hinge 208, with the aid of biasing elements 270, moves the display support 226 and the chassis 204, 206 relative to the spines 232 of the hinge 108 to provide clearance for the flexible display panel 214. In some embodiments, such as described and shown in FIG. 4, the elastic cover 258 is folded on itself with substantially no radius of curvature in the 360° position. In some embodiments, the elastic cover 258 elastically deforms to stretch over the hinge 208 and contact the display support 226 in the closed position. In some embodiments, the elastic cover 258 experiences elastic deformation in the presentation posture. In some embodiments, the elastic cover 258 experiences elastic deformation in the flat posture. In some embodiments, the elastic cover 258 experiences elastic deformation in the laptop posture.

Figure 6:
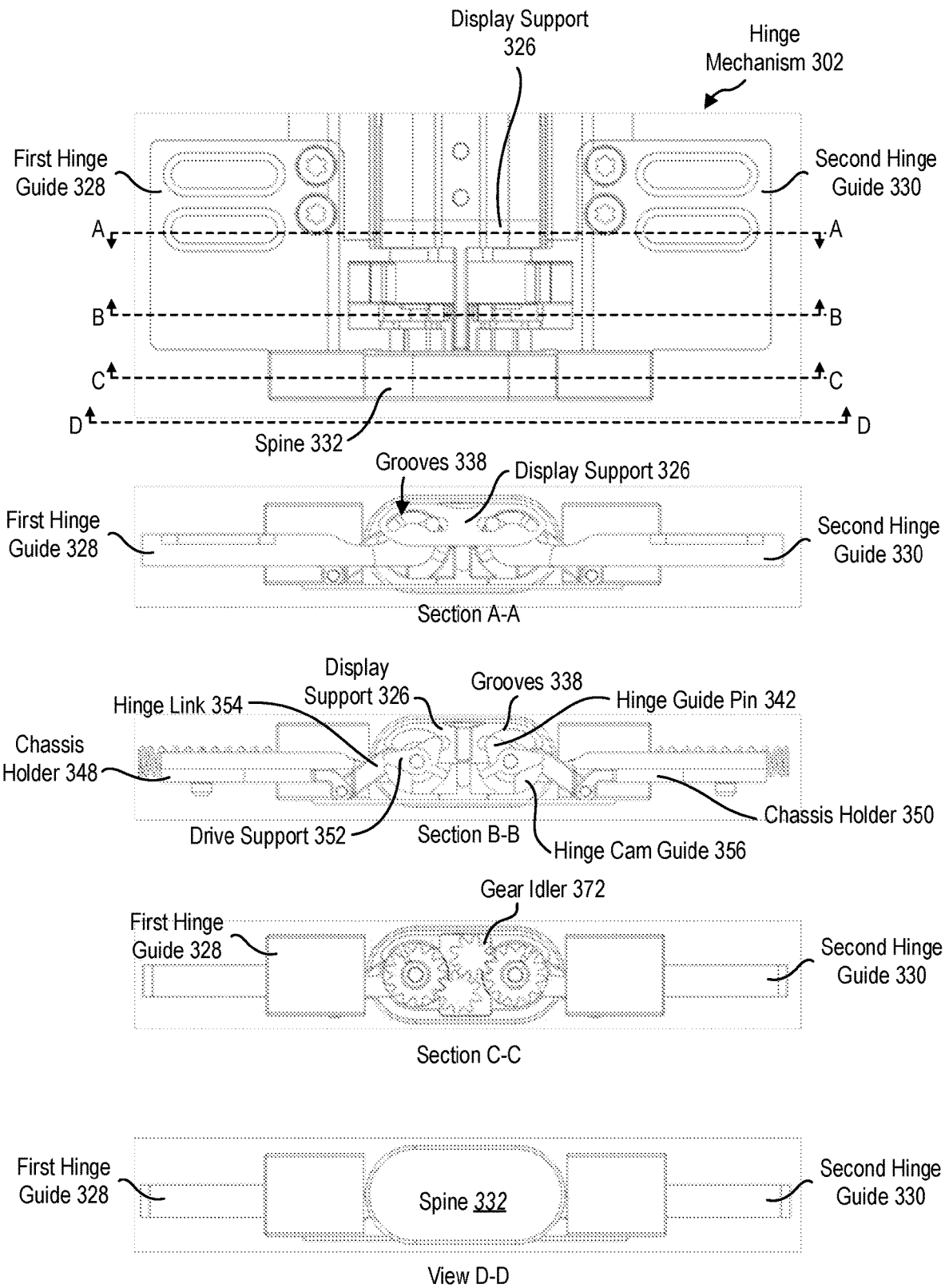
FIG. 6 is a top view and cross-sectional view series of a hinge mechanism in a flat posture, according to at least some embodiments of the present disclosure.

FIG. 6 through FIG. 11 illustrate an embodiment of a hinge mechanism 302 in a 360° rotational range of motion. Each figure shows a plurality of parallel cross-sectional views to illustrate the interaction of the components as the hinge mechanism 302 moves through the rotational range of motion. FIG. 6 is a reference detail view of a hinge mechanism 302 in a flat posture according to the present disclosure. FIG. 6 also shows end cross-sectional views of the hinge mechanism 302 in a flat posture through four section lines. The same section lines will be referenced in relation to FIG. 7 through FIG. 11 to describe the interaction of the components of the hinge mechanism 302 in the closed posture (FIG. 7), laptop posture (FIG. 8), flat posture (FIG. 9), presentation posture (FIG. 10), and 360° posture (FIG. 11), respectively.

Section A-A provides a cross-sectional view of the hinge mechanism 302 through the first hinge guide 328 and second hinge guide 330 at the display support 326. Section B-B is a cross-sectional view of the hinge mechanism 302 through the linkage that transmits force to move the chassis holders 348, 350. The linkage includes the drive supports 352 and the hinge links 354. The hinge cam guide 356 controls the range of motion of the drive supports 352. Section C-C is a cross-sectional view of the hinge mechanism through the gear idler 372 between the first hinge guide 328 and the second hinge guide 330. The gear idler 372 provides a mechanical connection through the meshed gears to correlate and synchronize the rotation of the first hinge guide 328 and the second hinge guide 330. The gear idles 372, thereby, can ensure the movement of the hinge mechanism 302 is symmetrical around the first axis and second axis. View D-D is an end view of the hinge mechanism 302 illustrating the rotational position of the first hinge guide 328 and second hinge guide 330 relative to the spine 332.

Figure 7:
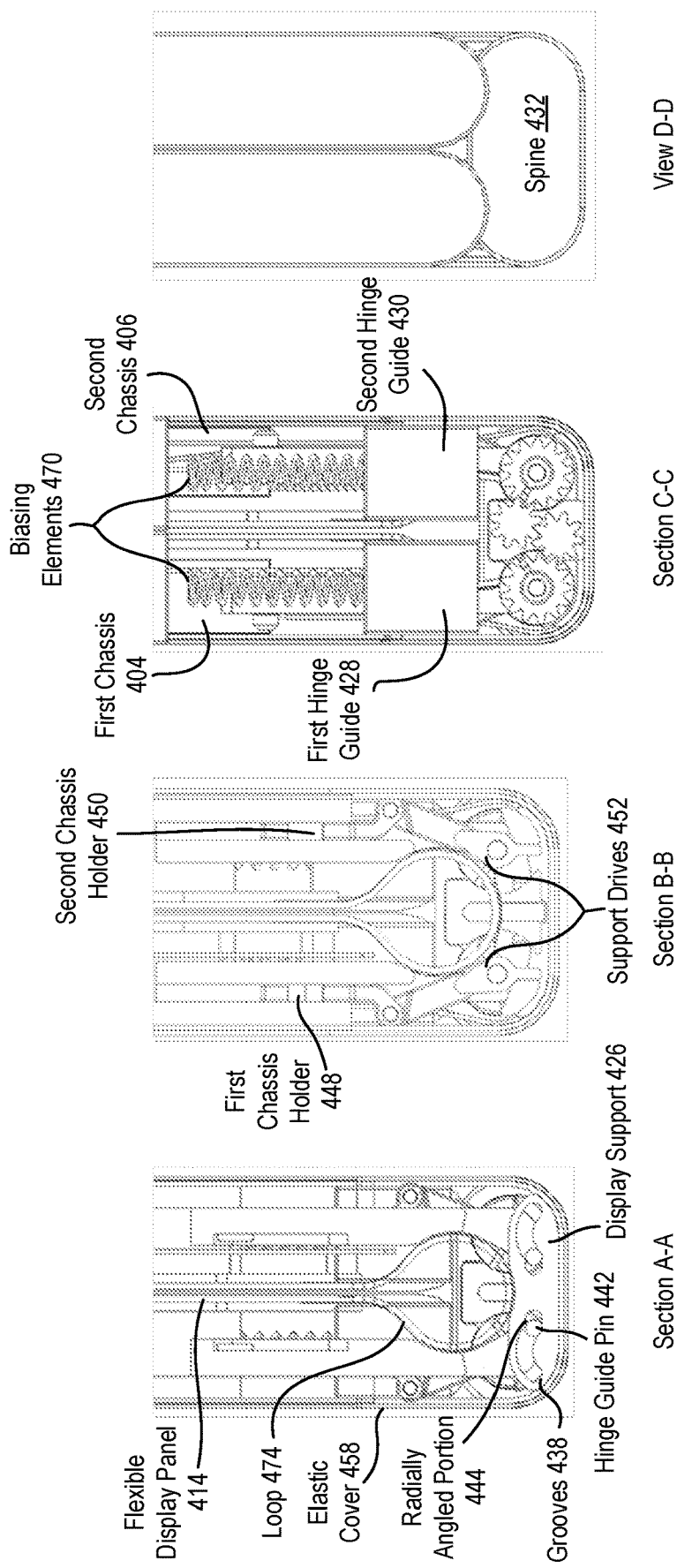
FIG. 7 is a cross-sectional view series of a hinge mechanism in a closed posture, according to at least some embodiments of the present disclosure.

FIG. 7 includes the views described in relation to FIG. 6 for an embodiment of the hinge mechanism 402 connected to the first chassis 404 and second chassis 406 of a foldable electronic device in a closed posture. Section A-A illustrates the hinge guide pins 442 positioned in the radially angled portion 444 of the grooves 438. The flexible display panel 414 is within the hinge mechanism and forms a loop 474 to maintain a minimum radius of curvature. In some embodiments, the loop 474 has a minimum radius of curvature of 1.0 mm. In some embodiments, the loop 747 has a minimum radius of curvature of 1.25 mm. In some embodiments, the loop 747 has a minimum radius of curvature of 1.5 mm. In some embodiments, the loop 747 has a minimum radius of curvature of 1.6 mm.

In the depicted closed posture, the display support 426 is translated to provide clearance for the loop 474 of the flexible display panel 414. In some embodiments, the elastic cover 458 is stretched away from the hinge mechanism by the display support 426 in the closed posture.

Section B-B illustrates the linkage that transmits force to the chassis holders 448, 450. In some embodiments in the closed posture, the support drives 452 are rotated to allow the chassis holders 448, 450 to move distally from the support drives 452. Section C-C illustrates the biasing elements 470 between the first chassis 404 and the first hinge guide 428 and between the second chassis 406 and the second hinge guide 430. The biasing elements 470 provide an expansion force between the hinge guides 428, 430 and the chassis 404, 406 to urge the chassis 404, 406 away from the hinge guides 428, 430. The result of which is the chassis 404, 406 moving away from the spine 432 as shown in View D-D.

Figure 8:
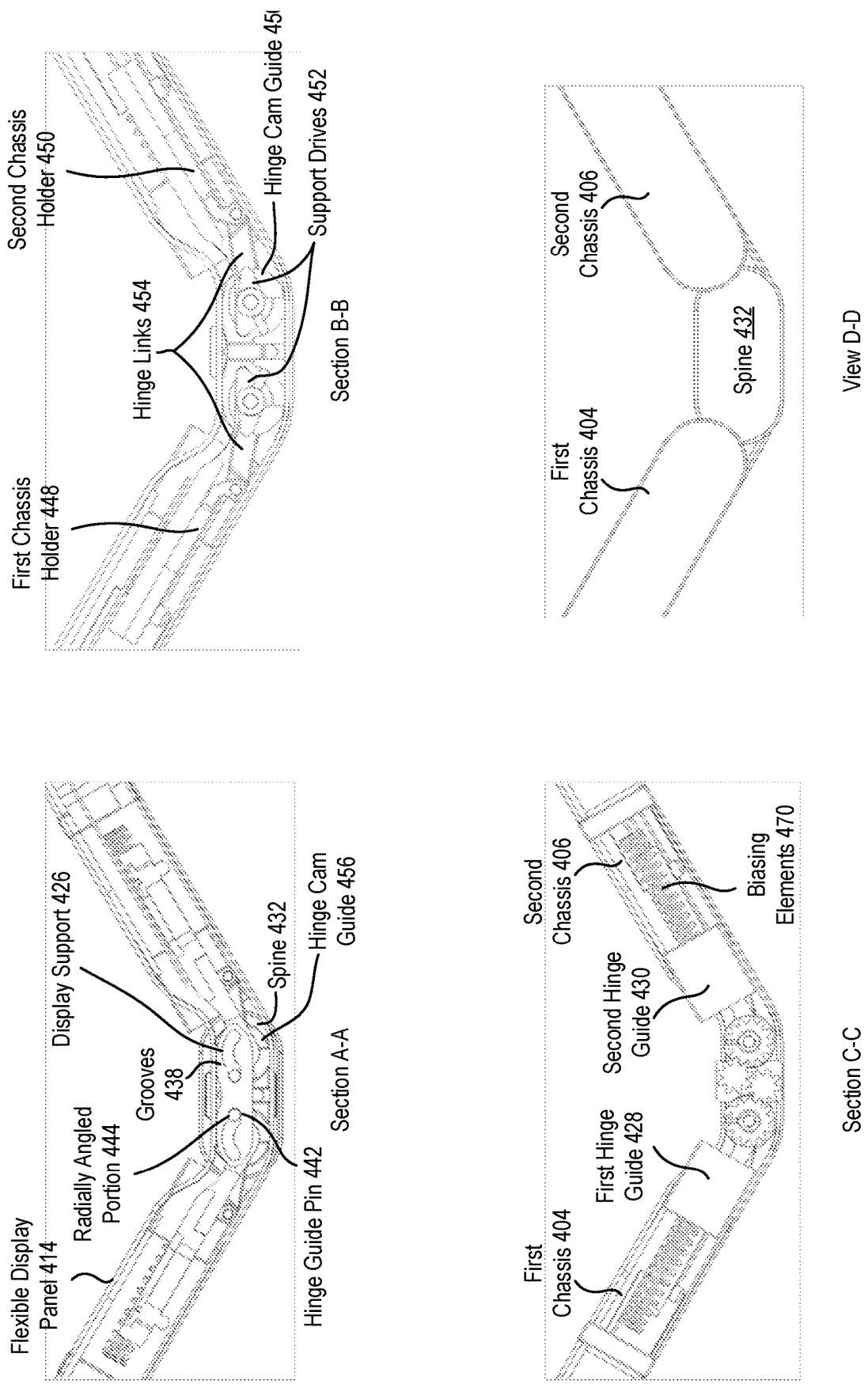
FIG. 8 is a cross-sectional view series of the hinge mechanism of FIG. 7 in a laptop posture, according to at least some embodiments of the present disclosure.

FIG. 8 includes the views described in relation to FIG. 6 for an embodiment of the hinge mechanism 402 connected to the first chassis 404 and second chassis 406 of a foldable electronic device in a laptop posture. Section A-A illustrates the hinge guide pins 442 positioned in the radially angled portion 444 of the grooves 438, and the leverage of the hinge guide pins 442 is translating the display support 426 upward relative to the spine 432 and the hinge cam guide 456. The flexible display panel 414 is guided out the hinge mechanism by the display support 426 to control the curvature of the flexible display panel 414 and avoid kinking or folding.

Section B-B illustrates the support drives 452 contacting a camming surface of the hinge cam guide 456, which stops the rotation of the support drives 452. Continued rotation of the hinge mechanism causes rotation of the hinge links 454 relative to the support drives 452, applying a tension to the first chassis holder 448 and second chassis holder 450 through the hinge links 454. The force applied by the hinge links 454 causes the chassis holders 448, 450 to move linearly toward the support drives 452.

Section C-C shows the effect of the movement of the chassis holders 448, 450 described in relation to Section B-B. As the chassis holders 448, 450 are fixed to the first chassis 404 and second chassis 406, respectively, the force on the chassis holders 448, 450 as the rotation continues will compress the biasing elements 470 and move the first chassis 404 toward the first hinge guide 428 and move the second chassis 406 toward the second hinge guide 430. View D-D shows the rotation of the first chassis 404 and second chassis 406 relative to the spine 432.

Figure 9:
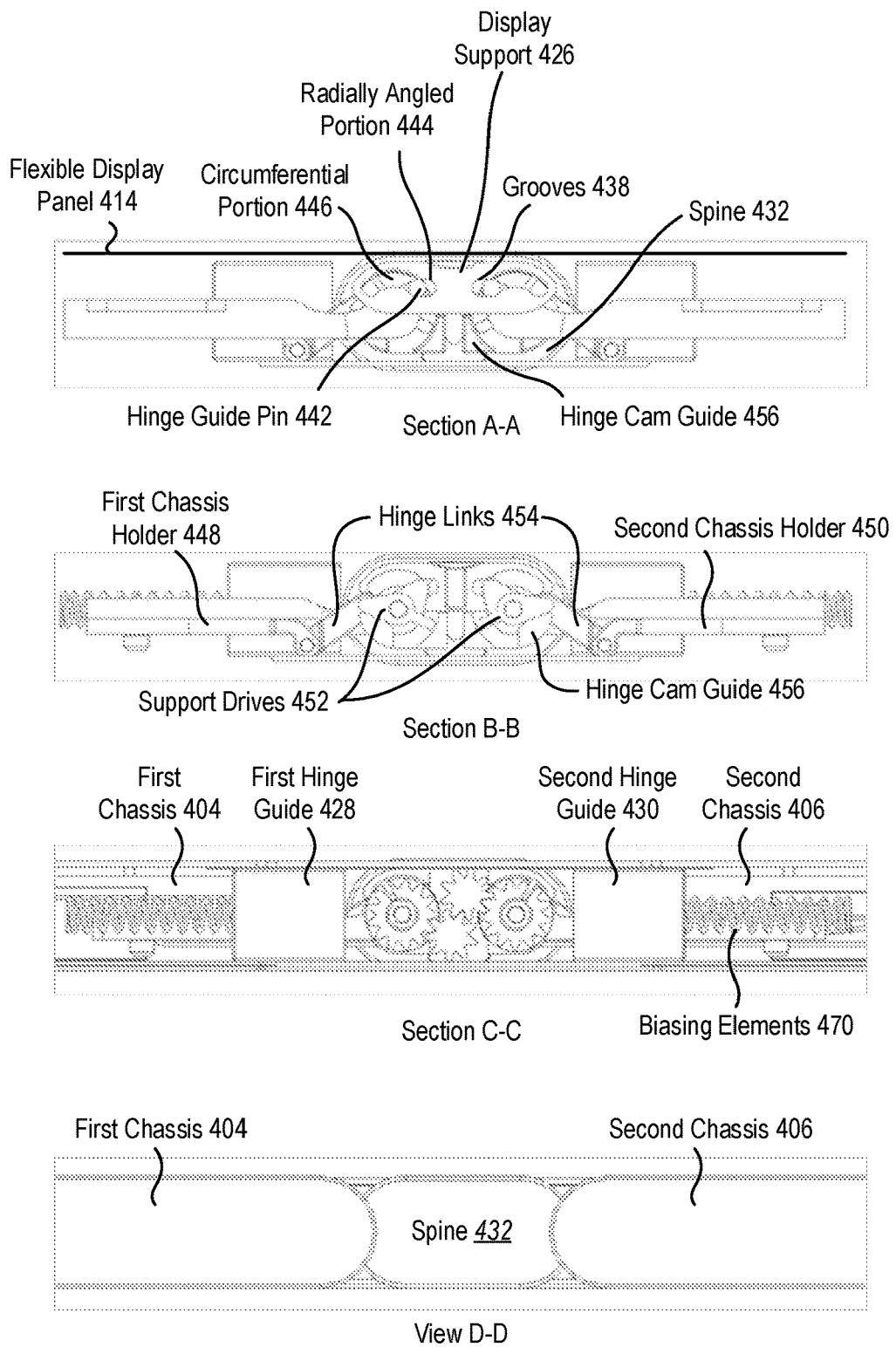
FIG. 9 is a cross-sectional view series of the hinge mechanism of FIG. 7 in a flat posture, according to at least some embodiments of the present disclosure.

FIG. 9 includes the views described in relation to FIG. 6 for an embodiment of the hinge mechanism 402 connected to the first chassis 404 and second chassis 406 of a foldable electronic device in a flat posture. Section A-A illustrates the hinge guide pins 442 exiting the radially angled portion 444 of the grooves 438 and entering the circumferential portion. The display support 426 has translated fully upward relative to the spine 432 and the hinge cam guide 456. The flexible display panel 414 is substantially flat and planar across the display support 426. In some embodiments, the display support 426 supports the flexible display panel 414 across the hinge to allow comfortable viewing and touch-based inputs.

Section B-B illustrates the support drives 452 in contact with a camming surface of the hinge cam guide 456. The rotation of the hinge mechanism causes further rotation of the hinge links 454 relative to the support drives 452, applying a tension to the first chassis holder 448 and second chassis holder 450 through the hinge links 454. The force applied by the hinge links 454 causes the chassis holders 448, 450 to continuing moving linearly toward the support drives 452.

Section C-C shows the effect of the movement of the chassis holders 448, 450 described in relation to Section B-B. As the chassis holders 448, 450 are fixed to the first chassis 404 and second chassis 406, respectively, the force on the chassis holders 448, 450 compresses the biasing elements 470 and moves the first chassis 404 toward the first hinge guide 428 and move the second chassis 406 toward the second hinge guide 430. View D-D shows the rotation of the first chassis 404 and second chassis 406 relative to the spine 432.

Figure 10:
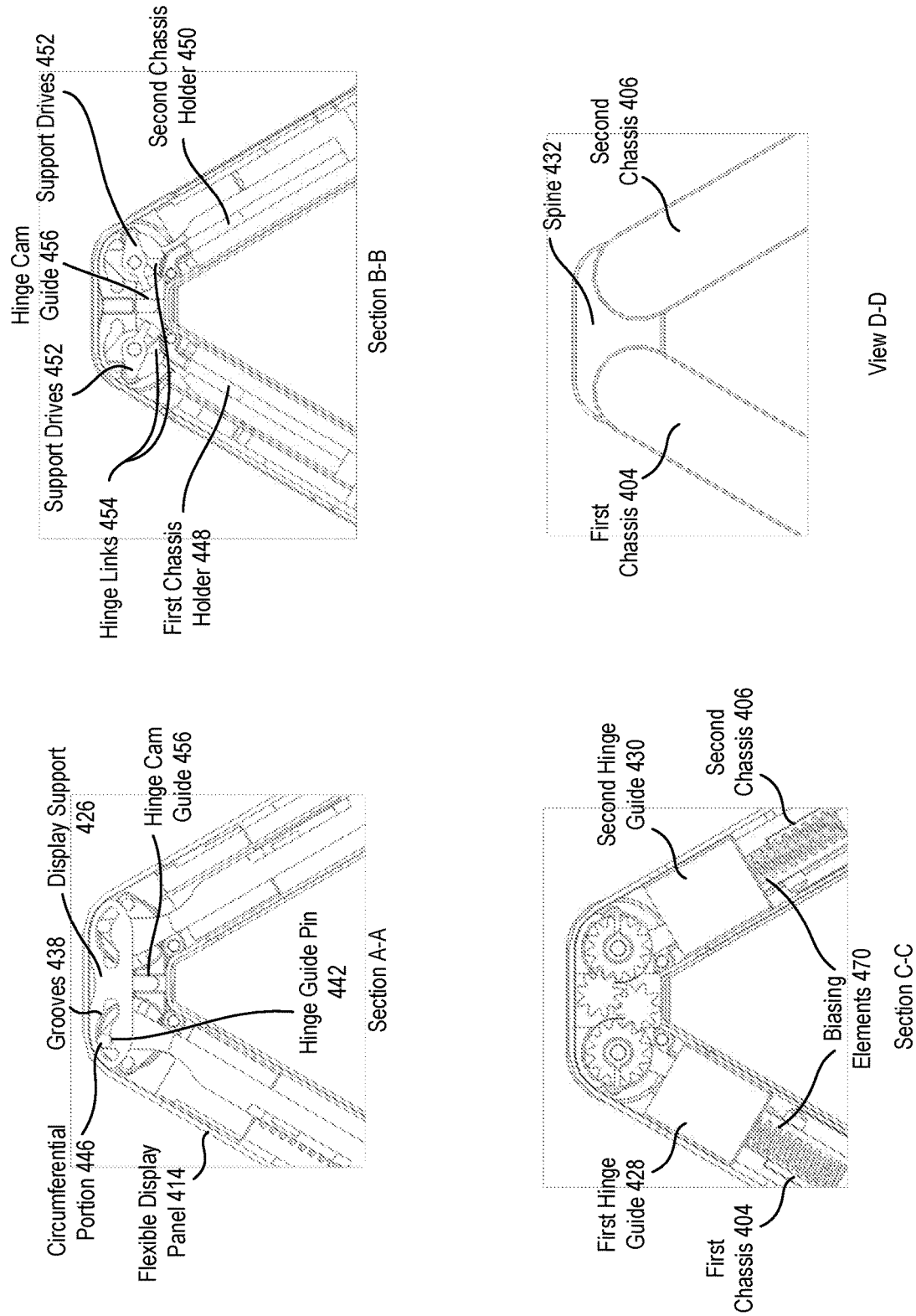
FIG. 10 is a cross-sectional view series of the hinge mechanism of FIG. 7 in a presentation posture, according to at least some embodiments of the present disclosure.

FIG. 10 includes the views described in relation to FIG. 6 for an embodiment of the hinge mechanism 402 connected to the first chassis 404 and second chassis 406 of a foldable electronic device in a presentation posture. Section A-A illustrates the hinge guide pins 442 in the circumferential portion 446 of the grooves 438. The display support 426 remains fully upward relative to the spine 432 and the hinge cam guide 456. The flexible display panel 414 is supported by the display support 426 on an exterior side of the hinge. In some embodiments, the display support 426 supports the flexible display panel 414 across the hinge to allow comfortable viewing and backing support for touch-based inputs.

Section B-B illustrates the support drives 452 in contact with a camming surface of the hinge cam guide 456. The rotation of the hinge mechanism causes further rotation of the hinge links 454 relative to the support drives 452, applying a tension to the first chassis holder 448 and second chassis holder 450 through the hinge links 454. The force applied by the hinge links 454 causes the chassis holders 448, 450 to continuing moving linearly toward the support drives 452.

Section C-C shows the effect of the movement of the chassis holders 448, 450 described in relation to Section B-B. As the chassis holders 448, 450 are fixed to the first chassis 404 and second chassis 406, respectively, the force on the chassis holders 448, 450 compresses the biasing elements 470 and moves the first chassis 404 toward the first hinge guide 428 and move the second chassis 406 toward the second hinge guide 430. View D-D shows the rotation and translation of the first chassis 404 and second chassis 406 relative to the spine 432.

Figure 11:
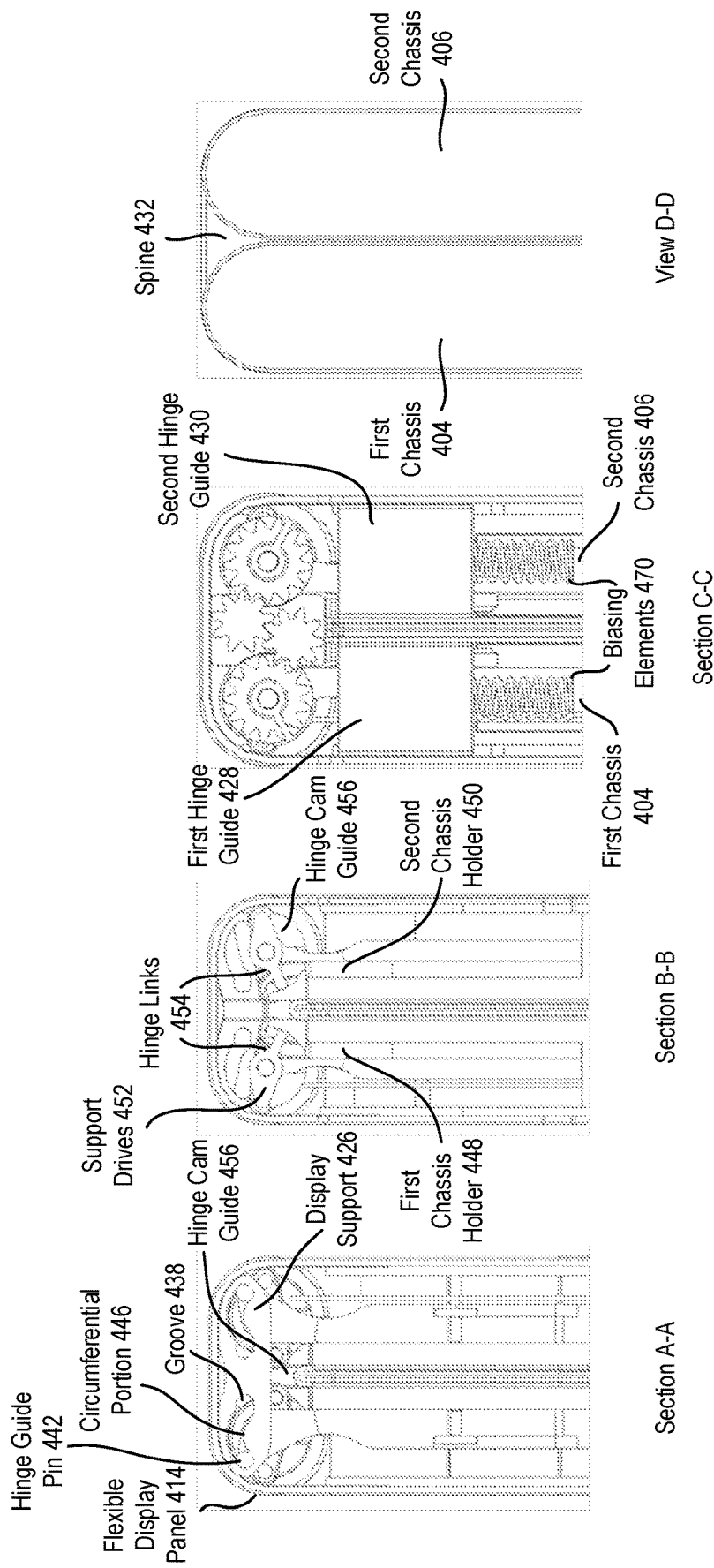
FIG. 11 is a cross-sectional view series of the hinge mechanism of FIG. 7 in a 360° posture, according to at least some embodiments of the present disclosure.

FIG. 11 includes the views described in relation to FIG. 6 for an embodiment of the hinge mechanism 402 connected to the first chassis 404 and second chassis 406 of a foldable electronic device in a 360° posture. Section A-A illustrates the hinge guide pins 442 at a terminal end of the circumferential portion 446 of the grooves 438. The display support 426 remains fully upward relative to the spine 432 and the hinge cam guide 456. The flexible display panel 414 is supported by the display support 426 on an exterior side of the hinge. In some embodiments, the display support 426 supports the flexible display panel 414 across the hinge to allow comfortable viewing and backing support for touch-based inputs.

Section B-B illustrates the support drives 452 in contact with a camming surface of the hinge cam guide 456. The rotation of the hinge mechanism causes further rotation of the hinge links 454 relative to the support drives 452, applying a tension to the first chassis holder 448 and second chassis holder 450 through the hinge links 454. The force applied by the hinge links 454 causes the chassis holders 448, 450 to continuing moving linearly toward the support drives 452.

Section C-C shows the effect of the movement of the chassis holders 448, 450 described in relation to Section B-B. As the chassis holders 448, 450 are fixed to the first chassis 404 and second chassis 406, respectively, the force on the chassis holders 448, 450 fully compresses the biasing elements 470 and moves the first chassis 404 toward the first hinge guide 428 and move the second chassis 406 toward the second hinge guide 430. View D-D shows the rotation and translation of the first chassis 404 and second chassis 406 relative to the spine 432.

In at least some embodiments, a hinge according to the present disclosure allows for a translatable display support in a foldable electronic device that can move to support a flexible display panel and protect the flexible display panel through a 360° rotation of the hinge. The hinge further includes movable chassis holders that displace the chassis to which the hinge is connected to provide clearance for the flexible display panel and maintain a path length around the hinge that does not damage the flexible display panel.

INDUSTRIAL APPLICABILITY

The present disclosure relates generally to systems and methods for controlling movement of portions of a foldable electronic device. More particularly, the present disclosure relates to embodiments of a hinge that supports a flexible display panel in a foldable electronic device. In some embodiments, a foldable electronic device has a flexible display panel that is continuous across a hinge between chassis. The flexible display has a minimum radius of curvature before the flexible display panel is damaged. Further, in some embodiments, the flexible display has limited or no in-plane elasticity, and an area of the flexible display panel must be maintained in and over the hinge as the foldable electronic device opens and closes through a variety of postures.

Embodiments of a hinge according to the present disclosure include a display support that translates in a first translational direction relative to the hinge and the chassis to provide clearance within the hinge and allow a larger radius of curvature in some postures and prevent damage to the flexible display panel when the flexible display panel is on an interior side of the foldable electronic device. In some embodiments, the display support translates in an opposite second translational direction to provide clearance and support to the flexible display panel when the flexible display panel is on an exterior side of the foldable electronic device.

In some embodiments, a foldable electronic device has a first chassis and a second chassis that rotatably connected to one another by a hinge. In some embodiments, the hinge allows the two chassis of the foldable electronic device to move through a rotational range of movement relative to one another of at least 180°. In some embodiments, the foldable electronic device is movable through a series of postures in the rotational range of movement from a closed posture with 0° between the first chassis and second chassis to a 360° posture with the hinge open to 360° between the first chassis and second chassis. Foldable electronic devices include, but are not limited to, laptop computers, hybrid computers, tablet computers, smartphones, large-format smartphones (e.g., phablets), and other portable electronic devices.

In some embodiment, the first chassis and/or second chassis are a rigid frame of the foldable electronic device. The chassis contains and/or supports components of the electronic device, such as a storage device, power supply, central processing unit (CPU), graphical processing unit (GPU), motherboard, bridge, communication device, antenna, communication ports, display panel, audio device, input device, other electronic components, thermal management devices, and other components. The foldable electronic device has a first chassis and a second chassis with communication cables or wires therebetween to allow electrical and/or data communication between electronic components contained in or on the first chassis and the second chassis.

The hinge is a rotationally movable connection between the first chassis and second chassis of the foldable electronic device. In some embodiments, the hinge includes at least two hinge mechanisms that each connect the first chassis to the second chassis. The two hinge mechanisms are connected through the display support and through the chassis to rotate together. In some embodiments, the hinge includes a friction mechanism that resists rotation of the first chassis and second chassis relative to one another to support the first chassis and second chassis at a variety of postures. In some embodiments, the hinge includes a linkage to correlate the rotational position of the first chassis and second chassis to a translational position of a display support relative to at least part of the hinge. In some embodiments, the hinge mechanism has two axes of rotation (e.g., two pins) and the rotation of the parts of hinge mechanism around those two axes is symmetrical. A 180° movement of the hinge mechanism includes 90° of movement around each of the axes. A 360° movement of the hinge mechanism includes 180° of movement around each of the axes.

In some embodiments, the foldable electronic device includes a flexible display panel. The flexible display panel is configured to emit light and display visual information and is bendable with a minimum radius of curvature. Visual information includes video, images, text, or other dynamically created patterns of light to convey information to a viewer of the display panel. In some embodiments, the flexible display panel is an organic light emitting diode (OLED) display panel. In some embodiments, the flexible display panel is a flexible electronic paper (e-paper) display panel. A flexible display panel can be a touch-sensitive display allowing capacitive or resistive touch-based interaction. The flexible display panel has a first fixed portion fixed relative to the first chassis, a second fixed portion fixed relative to the second chassis, and a free portion proximate the hinge that is allowed to bend in or around the hinge in various postures of the foldable electronic device.

In some embodiments, the flexible display panel is a continuous display panel that crosses the hinge and is at least partially located on and/or supported by the first chassis and second chassis. In some embodiments, a continuous display panel is a single flexible display panel that bridges the hinge in contrast to two discrete display panels that are coordinated to display visual information with an appearance of a single display.

In some embodiments, the foldable electronic device is positionable in a variety of postures. In some embodiments, the foldable electronic device has a plurality of postures between 0° and 360° around the hinge axes. In some embodiments, a closed posture is the posture of the foldable electronic device when the first chassis and second chassis are in a closed position with an approximate 0° angle between inner surfaces thereof. The flexible display panel is positioned between the first chassis and second chassis and protected for transport, storage, and charging.

In some embodiments, a laptop posture is the posture of the foldable electronic device when the first chassis and second chassis are positioned with an angle of between 0° and 180° between inner surfaces thereof. For example, when the first chassis and second chassis are positioned with an angle of 120° therebetween, the first chassis is positioned flat on a surface with the first fixed portion of the flexible display panel providing a touch-input "keyboard", and the second chassis is positioned to orient the second fixed portion of the display panel toward the user, similar to a conventional laptop, with the flexible display panel in the interior side of the angle.

In some embodiments, a flat posture is the posture of the foldable electronic device when the first chassis and second chassis are positioned with an angle of approximately 180° between inner surfaces thereof. In the flat posture, the flexible display panel is substantially flat, and at least 90% of the flexible display panel lies in a single plane.

In some embodiments, a presentation posture is the posture of the foldable electronic device when the first chassis and second chassis are positioned with an angle of between 180° and 360° between inner surfaces thereof. For example, when the when the first chassis and second chassis are positioned with an angle of 270° between inner surfaces thereof, the first chassis and the second chassis can support the hinge at an apex of the foldable electronic device to stand the foldable electronic device on the outermost edges of the first chassis and second chassis. The flexible display panel is oriented outward and visual information can be displayed to users from the first fixed portion of the flexible display panel (proximate the first chassis) or the second fixed portion of the flexible display panel (proximate the second chassis) in a freestanding posture. In another example, the first chassis is positioned flat on a surface with the first fixed portion of the flexible display panel oriented downward toward the surface, and the second chassis is positioned to orient the second fixed portion of the flexible display panel toward the user, providing a more compact posture for presentation of visual information to a user than a laptop posture.

In some embodiments, a 360° posture is the posture of the foldable electronic device in which the first chassis and second chassis are positioned with an angle of 360° between inner surfaces thereof. The foldable electronic device is fully opened and inverted from the closed posture with the flexible display panel positioned on the inner surfaces of the first chassis and second chassis facing outward and forming substantially all of the exterior surface of the foldable electronic device.

As the foldable electronic device moves from the closed posture to the 360° posture, the hinge translates a display support relative to a spine of the hinge to support the flexible display panel and provide clearance for the flexible display panel. In some embodiments, the hinge further allows linear displacement of the chassis relative to portions the hinge. By translating the connection points between the chassis and hinge, the hinge maintains an equal path length through or around the hinge for the flexible display panel as the foldable electronic device rotates. In some embodiments, the flexible display panel can bend within and interior of the hinge in the closed posture and bend around the exterior of the hinge in the 360° posture without compressing or stretching the flexible display panel in the plane of the flexible display panel.

In some embodiments, as the foldable electronic device moves from a closed posture to a laptop posture, the hinge rotates around the first axis and second axis to move the second chassis relative to the first chassis. A first fixed portion of the flexible display panel is supported on the first inner surface of the first chassis and a second fixed portion of the flexible display panel is supported on the second inner surface of the second chassis. A free portion of the flexible display panel crosses the hinge therebetween.

In some embodiments, the hinge includes a first hinge mechanism and a second hinge mechanism that are symmetrical on either side of the hinge. A rigid display support connects the hinge mechanisms across the width of the foldable electronic device. In some embodiments, the hinge mechanism includes a first hinge guide and a second hinge guide that are each rotatably connected to a spine. The first hinge guide is rotatable around a first pin at the first axis, and the second hinge guide is rotatable around a second pin at the second axis of the hinge mechanism.

In some embodiments, the translational position of the display support relative to the hinge guides and the spine is correlated to a first rotational position of the first hinge guide around the first axis and a second rotational position of the second hinge guide around the second axis. In some embodiments, the rotational positions and the translation position are correlated by the movement of hinge guide pins that track within grooves in the display support. In some embodiments, the shape of the grooves in the display support determine the rate and direction of the translation of the display support relative to the rotations of the first hinge guide and second hinge guide around the first axis and second axis, respectively.

In some embodiments, the hinge guide pins track within a radially angled portion of the groove between the closed posture and the flat posture. The radially angled portion of the groove is oriented at non-perpendicular angle to the radial direction of the axis. Rotation of the first hinge guide and second hinge guide around the pins of the spine, therefore, produces displacement of the display support relative to the spine as the hinge guide pins track through the radially angled portion of the groove.

As the foldable electronic device moves from the flat posture toward and through the presentation posture, in some embodiments, the hinge guide pins track through a circumferential portion of the grooves. The circumferential portion of the groove has no or approximately no change in the radial direction, and the angular movement through the circumferential portion of the groove results in no translation of the display support in the circumferential portion. In some embodiments, the circumferential portion of each groove has an arc of 90° around each of the axes. The 90° arc around each groove sums to a 180° movement of the foldable electronic device from the flat posture, through the presentation posture, to the 360° posture.

The rotation of the hinge guides from the flat posture to the 360° posture also includes conversion of the rotational movement of the hinge guides to linear movement of chassis holders. In some embodiments, the chassis holders are a pair of symmetrical components that each connect to one of the first hinge guide and the second hinge guide, respectively. In some embodiments, the chassis holder is fixed to a chassis on either side of the hinge (e.g., the first chassis holder is fixed to the first chassis and the second chassis holder is fixed to the second chassis) and is slidable in slots of the hinge guide. In some embodiments, the linear movement of the chassis holders in response to the rotational movement of the hinge guides moves the chassis toward or away from the spine of the hinge.

In some embodiments, the chassis holders move toward the spine as the foldable electronic device moves from the flat posture toward the 360° posture, and the chassis holders move away from the spine as the foldable electronic device moves away from the 360° posture and toward the flat posture. Because the flexible display panel bends and wraps around the exterior side of the spine and display support between the flat posture and the 360° posture, the linear movement of the chassis holders (and hence the chassis to which the flexible display panel is anchored) toward to the spine and display support ensures the flexible display panel is not under excessive tension while wrapped around the hinge.

In some embodiments, the chassis holders move linearly away from the spine and remain distant from the spine from the flat posture to the closed posture in order to move the chassis away from the spine and display support. In some embodiments, the chassis, and hence the fixed portions of the flexible display panel, move away from the hinge to provide clearance for the free portion of the flexible display panel to bend inside the hinge while maintaining the minimum radii of curvature of the flexible display panel to avoid damage.

In some embodiments, the linear position of the chassis holders in the slots is correlated to the rotational position of the hinge mechanism by the support drives and hinge links. The support drives are freely rotatable around each of the spine pins, respectively, in response to rotation around the spine pins of the hinge guides from the closed posture to the flat posture.

In some embodiments, the support drives interact with a hinge cam guide to limit and/or prevent further rotation of the support drives past the flat posture. In some embodiments, continued rotation of the hinge guides around the spine pins causes the support drives to contact a surface of the hinge cam guide and cause the support drives to apply a force to the chassis holders.

In some embodiments, the support drives pull the chassis toward the spine when the foldable electronic device moves toward the 360° posture. In some embodiments, the support drives push the chassis away from the spine when the foldable electronic device moves away from the 360° posture. In some embodiments, a biasing element urges the chassis away from the hinge guide and spine, and the forces applied to the chassis holders by the support drives pulls the chassis toward the hinge guide and spine when the foldable electronic device moves toward the 360° posture and the biasing element pushes the chassis away when the foldable electronic device moves away from the 360° posture. In some embodiments, the biasing element is a coil spring. In some embodiments, the biasing element is a piston and cylinder with a compressible medium therein such as a compressible gas. In some embodiments, the biasing element is one or more magnets that applies a magnetic force to the chassis.

In some embodiments, the first fixed portion of the flexible display panel is fixed to a first inner surface of the first chassis and the second fixed portion of the flexible display panel is fixed to a second inner surface of the second chassis. A free portion crosses the hinge between the first chassis and the second chassis and is free to move.

In some embodiments, the foldable electronic device includes an elastic cover positioned on the outer surfaces of the chassis. It should be understood that inner surface and outer surface are relative to the closed posture, and in the 360° posture, the inner surfaces of the chassis are oriented outward and the outer surfaces of the chassis are oriented inward relative to the chassis. In some embodiments, a first fixed portion of the elastic cover is fixed to a first outer surface of the first chassis and a second fixed portion of the elastic cover is fixed to a second outer surface of the second chassis. A free portion of the elastic cover crosses the hinge between the first chassis and the second chassis and is free to stretch.

As the elastic cover is able to withstand smaller radii of curvature than the flexible display panel, the hinge moves the display support and the chassis relative to the spines of the hinge to provide clearance for the flexible display panel. In some embodiments, the elastic cover is folded on itself with substantially no radius of curvature in the 360° position. In some embodiments, the elastic cover elastically deforms to stretch over the hinge and contact the display support in the closed position. In some embodiments, the elastic cover experiences elastic deformation in the presentation posture. In some embodiments, the elastic cover experiences elastic deformation in the flat posture. In some embodiments, the elastic cover experiences elastic deformation in the laptop posture.

In at least some embodiments, a hinge according to the present disclosure allows for a translatable display support in a foldable electronic device that can move to support a flexible display panel and protect the flexible display panel through a 360° rotation of the hinge. The hinge further includes movable chassis holders that displace the chassis to which the hinge is connected to provide clearance for the flexible display panel and maintain a path length around the hinge that does not damage the flexible display panel.

The present disclosure relates to systems and methods for providing a rotational connection in a foldable electronic device according to at least the examples provided in the sections below:

1. A hinge for a foldable electronic device, the hinge comprising:
   a spine;
   a first hinge guide rotatably connected to the spine around a first axis;
   second hinge guide rotatably connected to the spine around a second axis;
   a display support connected to the first hinge guide in a first track and connected to the second hinge guide by a second, wherein a translational position of the display support relative to the spine is related to a first rotational position of the first hinge guide relative to the spine and a second rotational position of the second hinge guide relative to the spine.
2. The hinge of section 1, further comprising:
   a first chassis holder slidably connected to the first hinge guide, wherein a linear position of the first chassis holder relative to the first hinge guide is related to a rotational position of the first hinge guide relative to the spine; and
   a second chassis holder slidably connected to the second hinge guide, wherein a linear position of the second chassis holder relative to the second hinge guide is related to a rotational position of the second hinge guide relative to the spine.
3. The hinge of section 2, further comprising:
   a first support drive configured to convert rotation of the first hinge guide to linear motion of the first chassis holder; and
   a second support drive configured to convert rotation of the second hinge guide to linear motion of the second chassis holder.
4. The hinge of section 3, further comprising:
   a first hinge link coupled to the first support drive and the first chassis holder to transmit force from the first support drive to the first chassis holder; and
   a second hinge link coupled to the second support drive and the second chassis holder to transmit force from the second support drive to the second chassis holder.
5. The hinge of section 4, further comprising a hinge cam guide that limits a range of motion of the first support drive and second support drive.
6. The hinge of any preceding section, wherein the first rotational position and the second rotational position are synchronized.
7. The hinge of section 6, wherein the first rotational position and the second rotational position are synchronized by a gear linkage between the first hinge guide and second hinge guide.
8. The hinge of any preceding section 1, wherein the translational position of the display support relative to the spine is related to a position of a first hinge guide pin in a first groove in the display support and a second hinge guide pin in a second groove.
9. The hinge of section 8, wherein the first groove has a radially angled portion that is oriented at a non-particular angle to the radial direction of the first axis.
10. The hinge of section 8, wherein the first groove has a circumferential portion that is an arc with a constant radius relative to the first axis.
11. The hinge of section 10, wherein the arc of the circumferential portion is a 90° arc around the first axis.
12. A foldable electronic device comprising:
    a first chassis;
    a second chassis;
    a hinge including:
      a spine;
      a first hinge guide rotatably connected to the spine;
      a second hinge guide rotatably connected to the spine;
      a display support connected to the first hinge guide in a first track and connected to the second hinge guide by a second track, wherein a translational position of the display support relative to the spine is related to a first rotational position of the first hinge guide relative to the spine and a second rotational position of the second hinge guide relative to the spine.
13. The foldable electronic device of section 12, further comprising a flexible display panel connected to the first chassis and second chassis.
14. The foldable electronic device of section 13, wherein the flexible display panel has a free portion between a first fixed portion fixed to a first inner surface of the first chassis and a second fixed portion fixed to a second inner surface of the second chassis.
15. The foldable electronic device of section 13, wherein the flexible display panel is an organic light emitting diode (OLED) panel.

16. The foldable electronic device of any of sections 12-15, further comprising an elastic cover connected to the first chassis and second chassis.

17. The foldable electronic device of any of sections 12-16, further comprising a biasing element positioned between the first hinge guide and the first chassis and a second biasing element positioned between the second hinge guide and the second chassis.

18. The foldable electronic device of any of sections 12-17, further comprising:
a first chassis holder slidably connected to the first hinge guide, wherein a linear position of the first chassis holder relative to the first hinge guide is related to a rotational position of the first hinge guide relative to the spine; and
a second chassis holder slidably connected to the second hinge guide, wherein a linear position of the second chassis holder relative to the second hinge guide is related to a rotational position of the second hinge guide relative to the spine,
wherein the first hinge guide includes a first slot and the second hinge guide includes a second slot,
the first chassis holder being slidably connected to the first hinge guide by fasteners that slide within the first slot and the second chassis holder being slidably connected to the second hinge guide by fasteners that slide within the second slot.

19. A foldable electronic device comprising:
a first chassis;
a second chassis;
a hinge including:
a spine;
a first hinge guide rotatably connected to the spine;
a second hinge guide rotatably connected to the spine;
a display support connected to the first hinge guide in a first track and connected to the second hinge guide by a second track, wherein a translational position of the display support relative to the spine is related to a first rotational position of the first hinge guide relative to the spine and a second rotational position of the second hinge guide relative to the spine;
a flexible OLED display panel connected to the first chassis and second chassis and crossing the hinge; and
an elastic cover connected to the first chassis and the second chassis and crossing the hinge.

20. The foldable electronic device of section 19, wherein:
the foldable electronic device has a closed posture with the flexible OLED display panel positioned on an inner surface of the first chassis and a second inner surface of the second chassis and the first inner surface and second inner surface are parallel such that the flexible OLED display touches itself and is covered by the first chassis, second chassis, and hinge in the closed posture, and
the flexible OLED display panel has no less than a 1.5-millimeter curvature of radius in the closed posture.

21. Any device, system, or method described or depicted herein.

The articles "a," "an," and "the" are intended to mean that there are one or more of the elements in the preceding descriptions. The terms "comprising," "including," and "having" are intended to be inclusive and mean that there may be additional elements other than the listed elements.

Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A hinge for a foldable electronic device, the hinge comprising:
a spine;
a first hinge guide rotatably connected to the spine around a first axis;
a second hinge guide rotatably connected to the spine around a second axis;
a display support connected to the first hinge guide in a first groove and connected to the second hinge guide by a second groove, wherein a translational position of the display support relative to the spine is related to a first rotational position of the first hinge guide relative to the spine and a second rotational position of the second hinge guide relative to the spine, wherein the first hinge and the second hinge cooperate to rotate from a zero degree orientation to a 270 degree orientation such that the display support is configured to contact a flexible OLED display panel from the zero degree orientation to the 270 degree orientation.

2. The hinge of claim 1, further comprising:
a first chassis holder slidably connected to the first hinge guide, wherein a linear position of the first chassis holder relative to the first hinge guide is related to a rotational position of the first hinge guide relative to the spine; and
a second chassis holder slidably connected to the second hinge guide, wherein a linear position of the second chassis holder relative to the second hinge guide is related to a rotational position of the second hinge guide relative to the spine.

3. The hinge of claim 2, further comprising:
a first support drive configured to convert rotation of the first hinge guide to linear motion of the first chassis holder; and
a second support drive configured to convert rotation of the second hinge guide to linear motion of the second chassis holder.

4. The hinge of claim 3, further comprising:
a first hinge link coupled to the first support drive and the first chassis holder to transmit force from the first support drive to the first chassis holder; and
a second hinge link coupled to the second support drive and the second chassis holder to transmit force from the second support drive to the second chassis holder.

5. The hinge of claim 4, further comprising a hinge cam guide that limits a range of motion of the first support drive and second support drive.

6. The hinge of claim 1, wherein the first rotational position and the second rotational position are synchronized.

7. The hinge of claim 6, wherein the first rotational position and the second rotational position are synchronized by a gear linkage between the first hinge guide and second hinge guide.

8. The hinge of claim 1, wherein the translational position of the display support relative to the spine is related to a position of a first hinge guide pin in the first groove in the display support and a second hinge guide pin in the second groove.

9. The hinge of claim 8, wherein the first groove has a radially angled portion that is oriented at a non-parallel angle to the radial direction of the first axis.

10. The hinge of claim 8, wherein the first groove has a circumferential portion that is an arc with a constant radius relative to the first axis.

11. The hinge of claim 10, wherein the arc of the circumferential portion is a 90° arc around the first axis.

12. The foldable electronic device of claim 1, wherein the display support is directly connected to the first hinge guide in the first groove.

13. A foldable electronic device comprising:
a first chassis;
a second chassis;
a hinge including:
  a spine;
  a first hinge guide rotatably connected to the spine;
  a second hinge guide rotatably connected to the spine;
  a display support connected to the first hinge guide in a first track and connected to the second hinge guide by a second track, wherein a translational position of the display support relative to the spine is related to a first rotational position of the first hinge guide relative to the spine and a second rotational position of the second hinge guide relative to the spine, wherein the first hinge and the second hinge cooperate to rotate the first chassis and the second chassis from a zero degree orientation to a 270 degree orientation such that the display support is configured to contact a flexible OLED display panel from the zero degree orientation to the 270 degree orientation.

14. The foldable electronic device of claim 13, further comprising the flexible OLED display panel connected to the first chassis and second chassis.

15. The foldable electronic device of claim 14, wherein the flexible display panel has a free portion between a first fixed portion fixed to a first inner surface of the first chassis and a second fixed portion fixed to a second inner surface of the second chassis.

16. The foldable electronic device of claim 14, wherein the flexible display panel is the organic light emitting diode (OLED) panel.

17. The foldable electronic device of claim 13, further comprising an elastic cover connected to the first chassis and second chassis.

18. The foldable electronic device of claim 13, further comprising a biasing element positioned between the first hinge guide and the first chassis and a second biasing element positioned between the second hinge guide and the second chassis.

19. The foldable electronic device of claim 13, further comprising:
a first chassis holder slidably connected to the first hinge guide, wherein a linear position of the first chassis holder relative to the first hinge guide is related to a rotational position of the first hinge guide relative to the spine; and
a second chassis holder slidably connected to the second hinge guide, wherein a linear position of the second chassis holder relative to the second hinge guide is related to a rotational position of the second hinge guide relative to the spine,
wherein the first hinge guide includes a first slot and the second hinge guide includes a second slot,
the first chassis holder being slidably connected to the first hinge guide by fasteners that slide within the first slot and the second chassis holder being slidably connected to the second hinge guide by fasteners that slide within the second slot.

20. A foldable electronic device comprising:
a first chassis;
a second chassis;
a hinge including:
  a spine;
  a first hinge guide rotatably connected to the spine;
  a second hinge guide rotatably connected to the spine;
  a display support connected to the first hinge guide in a first track and connected to the second hinge guide by a second track, wherein a translational position of the display support relative to the spine is related to a first rotational position of the first hinge guide relative to the spine and a second rotational position of the second hinge guide relative to the spine;
a flexible OLED display panel connected to the first chassis and second chassis and crossing the hinge, wherein the first hinge and the second hinge cooperate to rotate the first chassis and the second chassis from a zero degree orientation to a 270 degree orientation such that the display support contacts the flexible OLED display panel from the zero degree orientation to the 270 degree orientation; and an elastic cover connected to the first chassis and the second chassis and crossing the hinge.

21. The foldable electronic device of claim 20, wherein the foldable electronic device has a closed posture with the flexible OLED display panel positioned on an inner surface of the first chassis and a second inner surface of the second chassis and the first inner surface and second inner surface are parallel such that the flexible OLED display touches itself and is covered by the first chassis, second chassis, and hinge in the closed posture, and the flexible OLED display panel has no less than a 1.5-millimeter curvature of radius in the closed posture.

22. The foldable electronic device of claim 12, wherein the display support is directly connected to the second hinge guide by the second groove.

* * * * *